(12) United States Patent
Lim et al.

(10) Patent No.: US 11,744,095 B2
(45) Date of Patent: Aug. 29, 2023

(54) DISPLAY APPARATUS WITH TOP SUBSTRATE HAVING GROOVES INCLUDING REFLECTIVE LAYER, COLOR, AND QUANTUM DOT LAYER

(71) Applicant: Samsung Display Co., LTD., Yongin-si (KR)

(72) Inventors: Sanghyung Lim, Yongin-si (KR); Soonmi Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 337 days.

(21) Appl. No.: 17/060,573

(22) Filed: Oct. 1, 2020

(65) Prior Publication Data
US 2021/0296604 A1  Sep. 23, 2021

(30) Foreign Application Priority Data
Mar. 19, 2020  (KR) .......................... 10-2020-0034054

(51) Int. Cl.
*H10K 50/115* (2023.01)
*H10K 59/38* (2023.01)

(52) U.S. Cl.
CPC ........... *H10K 50/115* (2023.02); *H10K 59/38* (2023.02)

(58) Field of Classification Search
None
See application file for complete search history.

(56) References Cited

U.S. PATENT DOCUMENTS

| | | | |
|---|---|---|---|
| 6,630,274 B1 | 10/2003 | Kiguchi et al. | |
| 8,410,686 B2 | 4/2013 | Yamada et al. | |
| 9,110,202 B2 | 8/2015 | Um | |
| 10,151,867 B2 | 12/2018 | Shin et al. | |
| 2006/0012288 A1* | 1/2006 | Terakado | H01L 27/322 313/506 |
| 2017/0315289 A1* | 11/2017 | Cha | G02B 6/0023 |
| 2018/0045866 A1* | 2/2018 | Chae | G02F 1/133514 |

(Continued)

FOREIGN PATENT DOCUMENTS

| | | |
|---|---|---|
| JP | 2009-049135 | 3/2009 |
| KR | 10-1154368 | 6/2012 |

(Continued)

*Primary Examiner* — Nduka E Ojeh
(74) *Attorney, Agent, or Firm* — H.C. Park & Associates, PLC

(57) ABSTRACT

A display apparatus includes: a bottom substrate; a first light-emitable element, a second, light-emitable element, and a third light-emitable element disposed over the bottom substrate, at least one of the first, second, and third light-emitable elements including a first-color emission layer; a top substrate including a first groove, a second groove, and a third groove defined in a bottom surface thereof facing the bottom substrate, the top substrate being over the bottom substrate with the first, second, and third light-emitable elements therebetween; a reflective layer on inner surfaces of the first, second, and third grooves; a first-color color filter layer located at least partially in the first groove; each of a second-color color filter layer and a second-color quantum dot layer located at least partially in the second groove; and each of a third-color color filter layer and a third-color quantum dot layer located at least partially in the third groove.

19 Claims, 10 Drawing Sheets

(56) References Cited

U.S. PATENT DOCUMENTS

| | | | | |
|---|---|---|---|---|
| 2018/0151543 A1* | 5/2018 | Lee | ..................... | H01L 23/5386 |
| 2018/0284534 A1* | 10/2018 | Song | ................. | G02F 1/133528 |
| 2020/0144523 A1 | 5/2020 | Min et al. | | |
| 2021/0057678 A1* | 2/2021 | Motoyama | .......... | H01L 51/5275 |
| 2021/0193741 A1* | 6/2021 | Chen | ...................... | H10K 50/84 |
| 2021/0288117 A1* | 9/2021 | Lim | ..................... | H01L 51/524 |

FOREIGN PATENT DOCUMENTS

| | | |
|---|---|---|
| KR | 10-2016-0087450 | 7/2016 |
| KR | 10-2017-0140489 | 12/2017 |

\* cited by examiner

DISPLAY APPARATUS WITH TOP SUBSTRATE HAVING GROOVES INCLUDING REFLECTIVE LAYER, COLOR, AND QUANTUM DOT LAYER

CROSS REFERENCE TO RELATED APPLICATION

This application claims priority from and the benefit of Korean Patent Application No. 10-2020-0034054, filed on Mar. 19, 2020, which is hereby incorporated by reference for all purposes as if fully set forth herein.

BACKGROUND

Field

Exemplary implementations of the invention relate generally to a display apparatus, and more particularly, a display device having a low defect occurrence rate during a manufacturing process and a reduced amount of consumed materials.

Discussion of the Background

A display apparatus includes a plurality of pixels. For a full-color display is apparatus, a plurality of pixels may emit light of different colors. To this end, at least some of the pixels of the display apparatus have a color converting portion. Therefore, light of a first color generated from an emission portion of some pixels is converted to light of a second color while passing through a corresponding color converting portion and then emitted to the outside.

In a display apparatus according to the related art, a material for forming a color converting portion may be excessively consumed during a manufacturing process or a probability that a defect occurs during a process of forming the color converting portion, etc. is high.

The above information disclosed in this Background section is only for understanding of the background of the inventive concepts, and, therefore, it may contain information that does not constitute prior art.

SUMMARY

Display apparatuses constructed according to the principles and exemplary implementations of the invention are capable of providing a display apparatus with a low defect occurrence rate during a manufacturing process and a reduced amount of consumed materials.

Additional features of the inventive concepts will be set forth in the description which follows, and in part will be apparent from the description, or may be learned by practice of the inventive concepts.

According to one aspect of the invention, a display apparatus includes: a bottom substrate; a first light-emitable element, a second, light-emitable element, and a third light-emitable element disposed over the bottom substrate, at least one of the first, second, and third light-emitable elements including a first-color emission layer; a top substrate including a first groove, a second groove, and a third groove defined in a bottom surface thereof facing the bottom substrate, the top substrate being over the bottom substrate with the first, second, and third light-emitable elements therebetween; a reflective layer on inner surfaces of the first, second, and third grooves; a first-color color filter layer located at least partially in the first groove; each of a second-color color filter layer and a second-color quantum dot layer located at least partially in the second groove; and each of a third-color color filter layer and a third-color quantum dot layer located at least partially in the third groove.

The first, second, and third light-emitable elements may include: a first pixel electrode, a second pixel electrode, and a third pixel electrode; and an opposite electrode corresponding to the first, second, and third pixel electrodes, wherein the first-color emission layer may be disposed over the first, second, and third pixel electrodes disposed between the first, second, and third pixel electrodes and the opposite electrode.

The display apparatus may include the first-color emission layer to emit light in a first wavelength band, the second-color quantum dot layer to convert the light in the first wavelength band into light in a second wavelength band, and the third-color quantum dot layer to convert the light in the first wavelength band into light in a third wavelength band.

The reflective layer may be disposed on a portion of the bottom surface of the top substrate outside the first, second, and third grooves.

The second-color quantum dot layer may be disposed between the second-color color filter layer and the second light-emitable element, and the third-color quantum dot layer may be disposed between the third-color color filter layer and the third light-emitable element.

The display apparatus may include the first-color color filter layer contacting a bottom surface of the first groove, the second-color color filter layer contacting a bottom surface of the second groove, and the third-color color filter layer contacting a bottom surface of the third groove.

A first protective layer may be disposed between the second-color color filter layer and the second-color quantum dot layer and between the third-color color filter layer and the third-color quantum dot layer.

The first protective layer may be disposed as a single body over an entire surface of the top substrate.

A transparent layer may be located at least partially in the first groove disposed between the first-color color filter layer and the first light-emitable element.

The first protective layer may be disposed between the first-color color filter layer and the transparent layer.

A second protective layer may be disposed between the second-color quantum dot layer and the second light-emitable element and between the third-color quantum dot layer and the third light-emitable element.

The second protective layer may be disposed as a single body over an entire surface of the top substrate.

The display apparatus may have the second protective layer contacting the first protective layer over a portion of the bottom surface of the top substrate outside the first, second, and third grooves.

An inner surface of at least one of the first, second, and third grooves may be inclined with respect to the bottom surface of the top substrate.

A first cross-sectional area of at least one of the first, second, and third grooves along a first virtual plane substantially parallel to the bottom surface of the top substrate may be smaller than a second cross-sectional area of at least one of the first, second, and third grooves along a second virtual plane substantially parallel to the bottom surface of the top substrate, the second virtual plane may be closer to the bottom surface of the top substrate than the first virtual plane.

A bottom surface of at least one of the first, second, and third grooves may be generally convex in a direction to a top surface of the top substrate.

The second-color quantum dot layer may be disposed between the second-color color filter layer and the second light-emitable element, and the third-color quantum dot layer may be disposed between the third-color color filter layer and the third light-emitable element, and a surface of the second-color color filter layer in a direction to the second-color quantum dot layer may be substantially flat, and a surface of the third-color color filter layer in a direction to the third-color quantum dot layer is substantially flat.

The first, second, and third grooves may overlap the first, second, and third light-emitable elements when viewed in a direction substantially perpendicular to the top substrate.

The first-color color filter layer may be located in the first groove; each of the second-color color filter layer and the second-color quantum dot layer may be located in the second groove; and each of the third-color color filter layer and the third-color quantum dot layer may be located in the third groove.

Each of the first, second, and third light-emitable elements may include the first-color emission layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
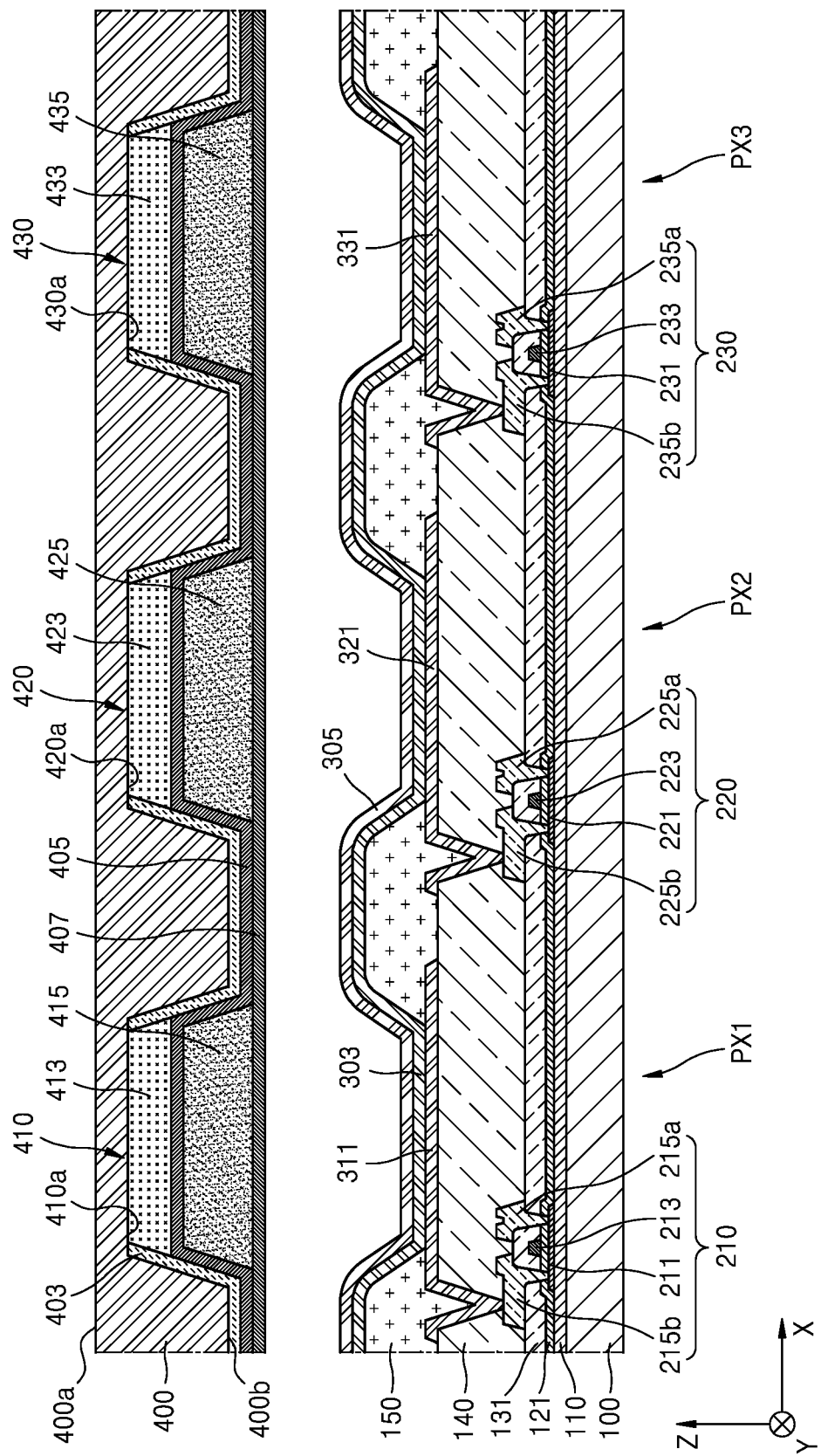
FIG. 1 is a cross-sectional view of an exemplary embodiment of a portion of a display apparatus constructed according to principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a cross-sectional view of an exemplary embodiment of a portion of a display apparatus constructed according to principles of the invention.

As shown in FIG. 1, the display apparatus according to some exemplary embodiments includes first to third pixels PX1, PX2, and PX3. These are provided as merely exemplary, and the display apparatus in other exemplary embodiments may include more pixels. FIG. 1 depicts that the first to third pixels PX1, PX2, and PX3 neighbor each other, the exemplary embodiment are not limited thereto. That is, elements such as other wirings, etc. may be arranged between the first to third pixels PX1, PX2, and PX3. Therefore, the first representative pixel PX1 and the second representative pixel PX2, for example, may not be neighboring pixels in other exemplary embodiments. In addition, in FIG. 1, the cross-sections of the first to third pixels PX1, PX2, and PX3 may not be cross-sections in the same direction.

The display apparatus according to some exemplary embodiments includes a bottom substrate 100. The bottom substrate 100 may include a glass, a metal, or a polymer resin. When the bottom substrate 100 is flexible or bendable, the bottom substrate 100 may include, for example, a polymer resin such as a polyethersulfone, a polyacrylate, a polyetherimide, a polyethylene naphthalate, a polyethylene terephthalate, a polyphenylene sulfide, a polyarylate, a polyimide, a polycarbonate, or a cellulose acetate propionate. The bottom substrate 100 may have a multi-layered structure including two layers and a barrier layer therebetween, the two layers including a polymer resin, and the barrier layer including an inorganic material (such as a silicon oxide, a silicon nitride, and a silicon oxynitride). However, various modifications may be made.

A first pixel electrode 311, a second pixel electrode 321, and a third pixel electrode 331 are located over the bottom substrate 100. A plurality of display elements are over the bottom substrate 100. In addition to the display elements, thin film transistors, that is, first to third thin film transistors 210, 220, and 230, may be also disposed or arranged over the bottom substrate 100, the first to third thin film transistors 210, 220, and 230 being electrically connected to the display elements. FIG. 1 depicts that organic light-emitting diodes as the display elements are arranged over the bottom substrate 100. It may be understood that, when the organic light-emitting diodes are electrically connected to the first to third thin film transistors 210, 220, and 230, pixel electrodes, that is, the first pixel electrode 311, the second pixel electrode 321, and the third pixel electrode 331, are electrically connected to the first to third thin film transistors 210, 220, and 230.

For reference, FIG. 1 depicts that the first thin film transistor 210 is arranged in the first pixel PX1, the second thin film transistor 220 is arranged in the second pixel PX2, and the third thin film transistor 230 is arranged in the third pixel PX3, and each of the first to third thin film transistors 210, 220, and 230 is electrically connected to the pixel electrode of the display element in a relevant pixel. Hereinafter, for convenience of description, the first thin film transistor 210 and the display element connected thereto are described. The description is applicable to the second thin film transistor 220 and the third thin film transistor 230 and the display elements connected thereto. That is, descriptions of a second semiconductor layer 221, a second gate electrode 223, a second source electrode 225a, and a second drain electrode 225b of the second thin film transistor 220 are omitted to avoid redundancy, and description of the second pixel electrode 321 is omitted. Likewise, descriptions of a third semiconductor layer 231, a third gate electrode 233, a third source electrode 235a, and a third drain electrode 235b of the third thin film transistor 230 are omitted to avoid redundancy, and description of the third pixel electrode 331 is omitted to avoid redundancy.

The first thin film transistor 210 may include a first semiconductor layer 211, a first gate electrode 213, a first source electrode 215a, and a first drain electrode 215b each including an amorphous silicon, a polycrystalline silicon, an organic semiconductor material, or an oxide semiconductor material. The first gate electrode 213 may include various conductive materials and have various layered structures, and include, for example, a Mo layer and an Al layer. Alternatively, the first gate electrode 213 may include a $TiN_x$ (titanium nitride) layer, an Al (aluminum) layer, and/or a Ti (titanium) layer. The first source electrode 215a and the first drain electrode 215b may include various conductive materials and have various layered structures, and include, for example, a Ti (titanium) layer, an Al (aluminum) layer and/or a Cu (copper) layer.

To secure insulation between the semiconductor 211 and the first gate electrode 213, a first gate insulating layer 121 may be arranged between the semiconductor 211 and the first gate electrode 213, the first gate insulating layer 121 including an inorganic material such as a silicon oxide, a silicon nitride, and a silicon oxynitride. A first interlayer insulating layer 131 may be arranged on the first gate electrode 213, the first interlayer insulating layer 131 including an inorganic material such as a silicon oxide, a silicon nitride, and a silicon oxynitride. The first source electrode 215a and the first drain electrode 215b may be arranged on the first interlayer insulating layer 131. An insulating layer including the inorganic material may be formed through chemical vapor deposition (CVD) or atomic layer deposition (ALD). This also applies to the exemplary embodiments below and modifications thereof.

A buffer layer 110 may be arranged between the first thin film transistor 210 having the above structure and the bottom substrate 100, the buffer layer 110 including an inorganic material such as a silicon oxide, a silicon nitride, and a silicon oxynitride. The buffer layer 110 may increase the flatness of a top surface of the bottom substrate 100 or prevent or minimize penetration of impurities from below the bottom substrate 100, etc. into the first semiconductor layer 211 of the first thin film transistor 210.

In addition, a planarization layer 140 may be arranged on the first thin film transistor 210. For example, as shown in FIG. 1, in the case where an organic light-emitting diode is arranged over the first thin film transistor 210, the planarization layer 140 may generally planarize a top surface of a protective layer covering the first thin film transistor 210. The planarization layer 140 may include an organic material such as an acryl, a benzocyclobutene (BCB), or a hexamethyldisiloxane (HMDSO). FIG. 1 depicts that the planarization layer 140 includes a single layer, the planarization layer 140 may include a multi-layer. However, various modifications may be made.

A display element may be located on the planarization layer 140 on the bottom substrate 100. For the display element, the organic light-emitting diode shown in FIG. 1 may be used. In the first pixel PX1, the organic light-emitting diode may include, for example, the first pixel electrode 311, an opposite electrode 305, and an intermediate layer 303, the intermediate layer 303 being arranged between the first pixel electrode 311 and the opposite electrode 305 and including an emission layer. The first pixel electrode 311 is electrically connected to the first thin film transistor 210 by contacting one of the first source electrode 215a and the first drain electrode 215b through an opening formed in the planarization layer 140, etc. as shown in FIG. 1. The second pixel PX2 includes the second pixel electrode 321, and the third pixel PX3 includes the third pixel electrode 331. Each of the first pixel electrode 311 to the third pixel electrode 331 includes a transparent conductive layer and a reflective layer, the transparent conductive layer including a conductive oxide, which is transparent, such as an indium tin oxide (ITO), an indium oxide (111203), or an indium zinc oxide (IZO), and the reflective layer including metal such as aluminum (Al) or silver (Ag). For example, each of the first pixel electrode 311 to the third pixel electrode 331 may include a three-layered structure of ITO/Ag/ITO.

The intermediate layer 303 including the emission layer may be formed as a single body over the first pixel electrode 311 to the third pixel electrode 331. The opposite electrode 305 on the intermediate layer 303 may also be formed as a single body over the first pixel electrode 311 to the third pixel electrode 331. The opposite electrode 305 may include a transparent conductive layer and a semi-transmissive layer, the transparent conductive layer including an ITO, $In_2O_3$, or an IZO, and the semi-transmissive layer including metal such as Al or Ag. For example, the opposite electrode 305 may include a semi-transmissive layer including magnesium and silver (MgAg).

A pixel-defining layer 150 may be arranged on the planarization layer 140. The pixel-defining layer 150 defines a pixel by including an opening corresponding to each pixel, that is, an opening that exposes at least a central portion of each of the first pixel electrode 311 to the third pixel electrode 331. In addition, in the case shown in FIG. 1, the pixel-defining layer 150 prevents an arc, etc. from occurring at the edges of the first pixel electrode 311 to the third pixel electrode 331 by increasing a distance between the opposite electrode 305 and each of the first pixel electrode 311 to the third pixel electrode 331. The pixel-defining layer 150 may include an organic material such as a polyimide or an HMDSO.

The intermediate layer 303 may include a low molecular weight material or a polymer material. In the case where the intermediate layer 303 includes a low molecular weight material, the intermediate layer 303 may have a structure in which a hole injection layer (HIL), a hole transport layer (HTL), an emission layer (EML), an electron transport layer (ETL), an electron injection layer (EIL), etc. are stacked in a single or composite configuration and be formed by using vacuum deposition. In the case where the intermediate layer 303 includes a polymer material, the intermediate layer 303 may have a structure including an HTL and an EML. In this case, the HTL may include poly-3, 4-ethylenedioxythiophene (PEDOT), and the EML may include a polymer material such as a polyphenylene vinylene (PPV)-based material and a polyfluorene-based material. The intermediate layer 303 may be formed by using screen printing, inkjet printing, deposition, or laser induced thermal image (LITI). The intermediate layer 303 is not necessarily limited thereto and may have various structures.

Although the intermediate layer 303 may be formed as a single body over the first pixel electrode 311 to the third pixel electrode 331 as described above, optionally, the intermediate layer 303 may include a patterned layer to correspond to the first pixel electrode 311 to the third pixel electrode 331. In any case, the intermediate layer 303 includes a first-color emission layer. The first-color emission layer may be formed as a single body over the first pixel electrode 311 to the third pixel electrode 331, and optionally, be patterned to correspond to each of the first pixel electrode 311 to the third pixel electrode 331. The first-color emission layer may emit light in a first wavelength band and emit light of, for example, about 450 nm to about 495 nm.

The opposite electrode 305 is located on the intermediate layer 303 to correspond to the first pixel electrode 311 to the third pixel electrode 331. The opposite electrode 305 may be formed as a single body over a plurality of organic light-emitting diodes.

Because the organic light-emitting diode may be easily damaged by external moisture or oxygen, etc., an encapsulation layer may cover and protect the organic light-emitting diode. The encapsulation layer may include a first inorganic encapsulation layer, an organic encapsulation layer, and a second inorganic encapsulation layer.

A top substrate 400 may be above the bottom substrate 100 with the opposite electrode 305 arranged between the top substrate 400 and the bottom substrate 100. The top substrate 400 may include a glass, a metal, or a polymer resin. When the top substrate 400 is flexible or bendable, the top substrate 400 may include, for example, a polymer resin such as a polyethersulfone, a polyacrylate, a polyetherimide, a polyethylene naphthalate, a polyethylene terephthalate, a polyphenylene sulfide, a polyarylate, a polyimide, a polycarbonate, or a cellulose acetate propionate. The top substrate 400 may have a multi-layered structure including two layers and a barrier layer therebetween, the two layers including a polymer resin, and the barrier layer including an inorganic material (such as a silicon oxide, a silicon nitride, and a silicon oxynitride). However, various modifications may be made.

The top substrate 400 includes a first groove 410, a second groove 420, and a third groove 430 defined in a bottom surface 400b in a direction (a (−) z direction) to the bottom substrate 100. The first groove 410 to the third groove 430 correspond to the first pixel electrode 311 to the third pixel electrode 331. When the first groove 410 to the third groove 430 correspond to the first pixel electrode 311 to the third pixel electrode 331, it means that each of the first groove 410 to the third groove 430 overlaps corresponding one of the first pixel electrode 311 to the third pixel electrode 331 when viewed in a direction substantially perpendicular to the top substrate 400. That is, when viewed in a direction (a z direction) substantially perpendicular to the bottom substrate 100, the first groove 410 overlaps the first pixel electrode 311, the second groove 420 overlaps the second pixel electrode 321, and the third groove 430 overlaps the third pixel electrode 331.

An inner surface of each of the first groove 410 to the third groove 430 of the top substrate 400 is inclined with respect to the bottom surface 400b of the top substrate 400. A cross-sectional area of each of the first groove 410 to the third groove 430 can be defined as a cross-sectional area thereof being taken along a virtual plane (an xy-plane) substantially parallel to the bottom surface 400b of the top substrate 400. The cross-sectional area of each of the first groove 410 to the third groove 430 is getting smaller in a direction from the bottom surface 400b to a top surface 400a. For example, a first cross-sectional area of each of the first groove 410 to the third groove 430 taken along a first virtual plane substantially parallel to the bottom surface 400b of the top substrate 400 is smaller than a second cross-sectional area of each of the first groove 410 to the third groove 430 taken along a second virtual plane substantially parallel to the bottom surface 400b of the top substrate, if the second virtual plane being closer to the bottom surface 400b of the top substrate 400 than the first virtual plane.

A reflective layer 403 is arranged in the first groove 410 to the third groove 430. Specifically, the reflective layer 403 is arranged on an inner surface of the first groove 410 to the third groove 430. The reflective layer 403 may include a metal having reflectivity such as Al or Ag. As shown in FIG. 1, the reflective layer 403 is arranged not only in the first groove 410 to the third groove 430 but also on the bottom surface 400b of the top substrate 400 in a direction to the bottom substrate 100. Specifically, the reflective layer 403 may cover outer portions of the first groove 410 to the third groove 430 among the bottom surface 400b of the top substrate 400. The reflective layer 403 does not cover at least a portion of each of a first bottom surface 410a of the first groove 410, a second bottom surface 420a of the second groove 420, and a third bottom surface 430a of the third groove 430.

A first-color color filter layer 413 is arranged in the first groove 410. A second-color color filter layer 423 and a second-color quantum dot layer 425 are arranged in the second groove 420. A third-color color filter layer 433 and a third-color quantum dot layer 435 are arranged in the third groove 430.

The first-color color filter layer 413 may pass only light having a wavelength of about 450 nm to about 495 nm, the second-color color filter layer 423 may pass only light having a wavelength of about 495 nm to about 570 nm, and the third-color color filter layer 433 may pass only light having a wavelength of about 630 nm to about 780 nm. The first-color color filter layer 413 to the third-color color filter layer 433 may reduce external light reflection in the display apparatus.

For example, when external light reaches the first-color color filter layer 413, only light having a wavelength set described above in advance passes through the first-color color filter layer 413 and light having other wavelengths is absorbed by the first-color color filter layer 413. Therefore, only light having the wavelength set in advance described above passes through the first-color color filter layer 413 among external light incident to the display apparatus, and a portion of the light having the wavelengths set in advance is reflected by the opposite electrode 305 or the first pixel electrode 311 and thus emitted to the outside. Consequently, because a portion of external light incident to where the first pixel PX1 is arranged is reflected to the outside, external light reflection may be reduced. This description is applicable to the second-color color filter layer 423 and the third-color color filter layer 433.

The second-color quantum dot layer 425 may convert light in a first wavelength band into light in a second wavelength band, the light in the first wavelength band being generated from the intermediate layer 303 on the second pixel electrode 321. For example, when light having a wavelength of about 450 nm to about 495 nm is generated from the intermediate layer 303 on the second pixel electrode 321, the second-color quantum dot layer 425 may convert the light into light having a wavelength of about 495 nm to about 570 nm. Therefore, the second pixel PX2 emits light having a wavelength of about 495 nm to about 570 nm to the outside through the top substrate 400.

The third-color quantum dot layer 435 may convert light in the first wavelength band into light in a third wavelength band, the light in the first wavelength band being generated from the intermediate layer 303 on the third pixel electrode 331. For example, when light having a wavelength of about 450 nm to about 495 nm is generated from the intermediate layer 303 on the third pixel electrode 331, the third-color quantum dot layer 435 may convert this light into light having a wavelength of about 630 nm to about 780 nm. Therefore, the third pixel PX3 emits light having a wavelength of about 630 nm to about 780 nm to the outside through the top substrate 400.

The second-color quantum dot layer 425 and the third-color quantum dot layer 435 each may have a configuration in which quantum dots are dispersed inside a resin. A quantum dot includes a semiconductor material such as a cadmium sulfide (CdS), a cadmium telluride (CdTe), a zinc sulfide (ZnS), or an indium phosphide (InP). A quantum dot may have a size of several nanometers. The wavelength of light after the conversion may change depending on the size of a quantum dot. A resin included in the second-color quantum dot layer 425 and the third-color quantum dot layer 435 may be any material as long as it is a transparent material. For example, a polymer resin such as a BCB or an HMDSO may be used as a material for forming the second-color quantum dot layer 425 and the third-color quantum dot layer 435.

The first pixel PX1 emits light having the first wavelength generated from the intermediate layer 303 to the outside without wavelength conversion. Therefore, the first pixel PX1 does not include a quantum dot layer. Because the quantum dot layer is omitted from the first groove 410, a transparent layer 415 including a transparent resin is arranged. The transparent layer 415 may include an acryl, a BCB, or an HMDSO. Unlike FIG. 1, the transparent layer 415 may not be arranged in the first groove 410 in some exemplary embodiments.

In the display apparatus according to some exemplary embodiments, the first pixel PX1 emits light in the first wavelength band to the outside, the second pixel PX2 emits light in the second wavelength band to the outside, and the third pixel PX3 emits light in the third wavelength band to the outside. Therefore, the display apparatus according to some exemplary embodiments may display a full-color image.

During a manufacturing process, the first groove 410 to the third groove 430 are formed in the top substrate 400, and then the first-color color filter layer 413 to the third-color color filter layer 433 are arranged in the first groove 410 to the third groove 430. Therefore, materials used in the process of forming the first-color color filter layer 413 to the third-color color filter layer 433 may be effectively prevented from being mixed with each other. For example, when forming the first-color color filter layer 413 and forming the second-color color filter layer 423, in the display apparatus according to the related art, a material used for forming the first-color color filter layer 413 and a material used for forming the second-color color filter layer 423 may be mixed with each other. In contrast, in the display apparatus according to some exemplary embodiments, because the first-color color filter layer 413 to the third-color color filter layer 433 are arranged in the first groove 410 to the third groove 430, materials for forming the first-color color filter layer 413 to the third-color color filter layer 433 may be effectively prevented from being mixed with each other.

In the display apparatus according to the related art, prior to the forming of the first-color color filter layer and the second-color color filter layer, it may be considered to form a barrier layer in a space therebetween. However, in this case, to form the relevant layer to a sufficient height, a first barrier layer should be formed and then a second barrier layer should be formed. Therefore, the process is complicated. In contrast, in the display apparatus according to some exemplary embodiments, because there is no process of forming the barrier layer in the manufacturing process, the manufacturing process is simplified and a defect rate may be reduced.

In the display apparatus according to some exemplary embodiments, the second-color quantum dot layer 425 and the third-color quantum dot layer 435 are also arranged in the first groove 410 to the third groove 430 as described above. Therefore, the descriptions of the first-color color filter layer 413 to the third-color color filter layer 433 are applicable to the second-color quantum dot layer 425 and the third-color quantum dot layer 435. That is, in the display apparatus according to some exemplary embodiments, materials used in the process of forming the second-color quantum dot layer 425 and the third-color quantum dot layer 435 may be effectively prevented from being mixed with each other in the manufacturing process.

For reference, the second-color quantum dot layer 425 is arranged between the second-color color filter layer 423 and the opposite electrode 305. Because the second-color color filter layer 423 passes light in the second wavelength band, it is required that light in the first wavelength band generated from the intermediate layer 303 is converted to light in the second wavelength band by the second-color quantum dot layer 425 before the light in the first wavelength band is incident to the second-color color filter layer 423 that passes light in the second wavelength band. For the same reason, the third-color quantum dot layer 435 is arranged between the third-color color filter layer 433 and the opposite electrode 305. Therefore, the first-color color filter layer 413 may contact the first bottom surface 410a of the first groove 410, the second-color color filter layer 423 may contact the second bottom surface 420a of the second groove 420, and the third-color color filter layer 433 may contact the third bottom surface 430a of the third groove 430.

The second-color quantum dot layer 425 and the third-color quantum dot layer 435 is typically prevented from being damaged during the manufacturing process or a use process after the manufacturing. The outgas generated from the second-color color filter layer 423 is generally prevented from damaging quantum dots in the second-color quantum dot layer 425 and the quantum dots is generally prevented from being unable to convert light in the first wavelength band into light in the second wavelength band. Likewise, the outgas generated from the third-color color filter layer 433 is generally prevented from damaging quantum dots in the third-color quantum dot layer 435 and the quantum dots is generally prevented from being unable to convert light in the first wavelength band into light in the third wavelength band. For this purpose, a first protective layer 405 may be arranged between the second-color color filter layer 423 and the second-color quantum dot layer 425 and between the third-color color filter layer 433 and the third-color quantum dot layer 435. The first protective layer 405 may include an inorganic material such as a silicon oxide, a silicon nitride, or a silicon oxynitride to prevent the gas from passing through the first protective layer 405. The first protective layer 405 may be formed as a single body over the entire surface of the top substrate 400. Therefore, the first protective layer 405 is arranged between the first-color color filter layer 413 and the transparent layer 415 in the first groove 410 of the top substrate 400.

Because the first protective layer 405 includes an inorganic material, the first protective layer 405 has a shape corresponding to a layer thereunder when formed. Therefore, as shown in FIG. 1, the first protective layer 405 is formed substantially flat on a portion of the reflective layer 403 arranged outside the first groove 410 to the third groove 430 of the top substrate 400, formed along the reflective layer 403 in the first groove 410 to the third groove 430, and formed to contact the first-color color filter layer 413 to the third-color color filter layer 433. A process of forming the first protective layer 405 is described below.

The intermediate layer 303 of the organic light-emitting diode is typically very vulnerable to impurities such as moisture or oxygen, etc. from the outside. Therefore, the outgas generated from the second-color quantum dot layer 425 and the third-color quantum dot layer 435 is typically prevented from moving in a direction to the intermediate layer 303 during a manufacturing process or during usage after the manufacturing is completed. For this purpose, a second protective layer 407 may be arranged between the second-color quantum dot layer 425 and the opposite electrode 305 and arranged between the third-color quantum dot layer 435 and the opposite electrode 305. The second protective layer 407 may include an inorganic material such as a silicon oxide, a silicon nitride, or a silicon oxynitride to prevent the gas from passing through the second protective layer 407. The second protective layer 407 may be formed as a single body over an entire surface of the top substrate 400. Therefore, the second protective layer 407 contacts the transparent layer 415 in the first groove 410 of the top substrate 400, contacts the second-color quantum dot layer 425 in the second groove 420, and contacts the third-color quantum dot layer 435 in the third groove 430. In addition, the second protective layer 407 contacts the first protective layer 405 on a portion of the bottom surface 400b of the top substrate 400 outside the first groove 410 to the third groove 430.

FIGS. 2, 3, 4, 5, 6, 7, and 8 are cross-sectional views or plan views illustrating an exemplary embodiment of a process for manufacturing a portion of the display apparatus of FIG. 1. Specifically, FIGS. 2 to 8 are cross-sectional views or plan views showing a process of manufacturing the top substrate 400, the first-color color filter layer 413 to the third-color color filter layer 433, the second-color quantum dot layer 425, the third-color quantum dot layer 435, the first protective layer 405, and the second protective layer 407 of the display apparatus of FIG. 1.

Figure 2:
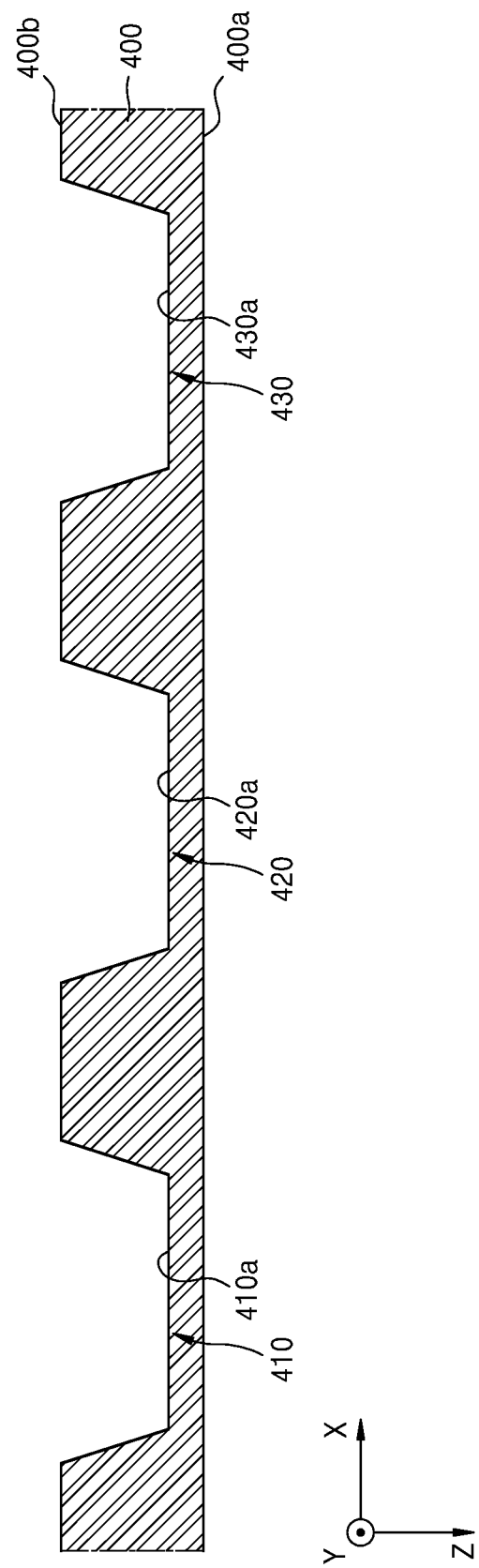
FIGS. 2, 3, 4, 5, 6, 7, and 8 are cross-sectional views or plan views illustrating an exemplary embodiment of a process for manufacturing a portion of the display apparatus of FIG. 1.
Figure 3:
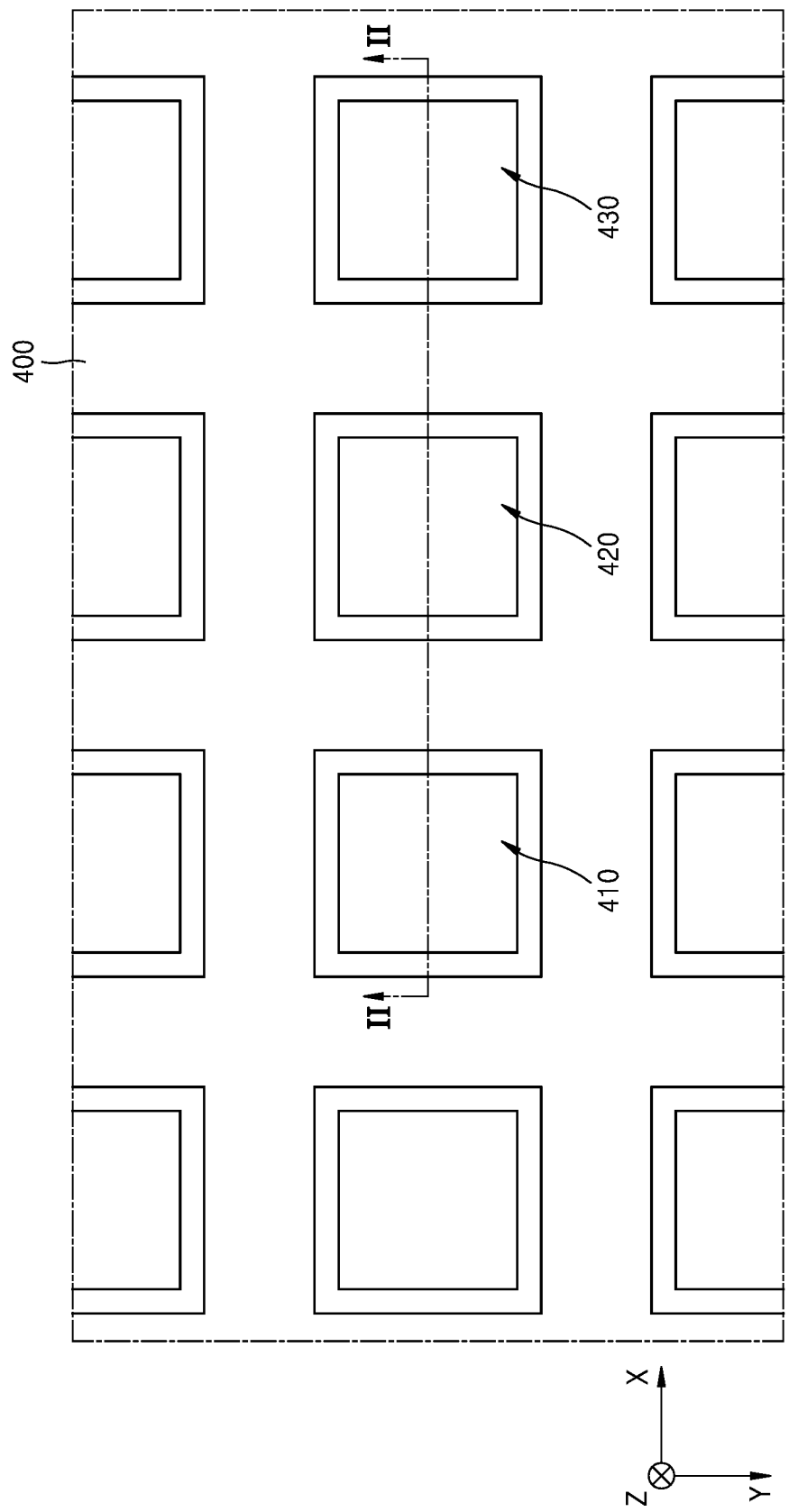

First, as shown in FIGS. 2 and 3, the first groove 410 to the third groove 430 are formed in the bottom surface 400b of the top substrate 400 in the (−) z direction. FIG. 2 may be understood as a cross-section taken along line II-II of FIG. 3, which is a plan view. The first groove 410 to the third groove 430 may be formed by using wet etching that uses a photoresist. Because the first groove 410 to the third groove 430 are formed by using wet etching, an inner surface of each of the first groove 410 to the third groove 430 is inclined with respect to the bottom surface 400b of the top substrate 400. This allows the reflective layer 403 subsequently formed on an inner surface of each of the first groove 410 to the third groove 430 without defects. In this case, the cross-sectional area of each of the first groove 410 to the third groove 430 can be defined as a cross-sectional area of the first groove 410 to the third groove 430 being taken along a virtual plane (an xy-plane) substantially parallel to the bottom surface 400b of the top substrate 400. The cross-sectional area of each of the first groove 410 to the third groove 430 is getting smaller in a direction from the bottom surface 400b to a top surface 400a. For example, a first cross-sectional area of each of the first groove 410 to the third groove 430 taken along a first virtual plane substantially parallel to the bottom surface 400b of the top substrate 400 is smaller than a second cross-sectional area of each of the first groove 410 to the third groove 430 taken along a second virtual plane substantially parallel to the bottom surface 400b of the top substrate, if the second virtual plane being closer to the bottom surface 400b of the top substrate 400 than the first virtual plane.

When the top substrate 400 includes a polymer resin such as a polyimide, a material for forming the top substrate 400 itself may have photoresist characteristics. In this case, the first groove 410 to the third groove 430 having the shape shown in FIGS. 2 and 3 may be formed by coating the material for forming the top substrate 400 on a carrier substrate, exposing a specific portion, and developing the same. Then, the top substrate 400 having the shape shown in FIGS. 2 and 3 may be formed by irradiating ultraviolet (UV) light to the structure in which the first groove 410 to the third groove 430 are formed and hardening the material for forming the top substrate 400. The carrier substrate is removed.

Figure 4:
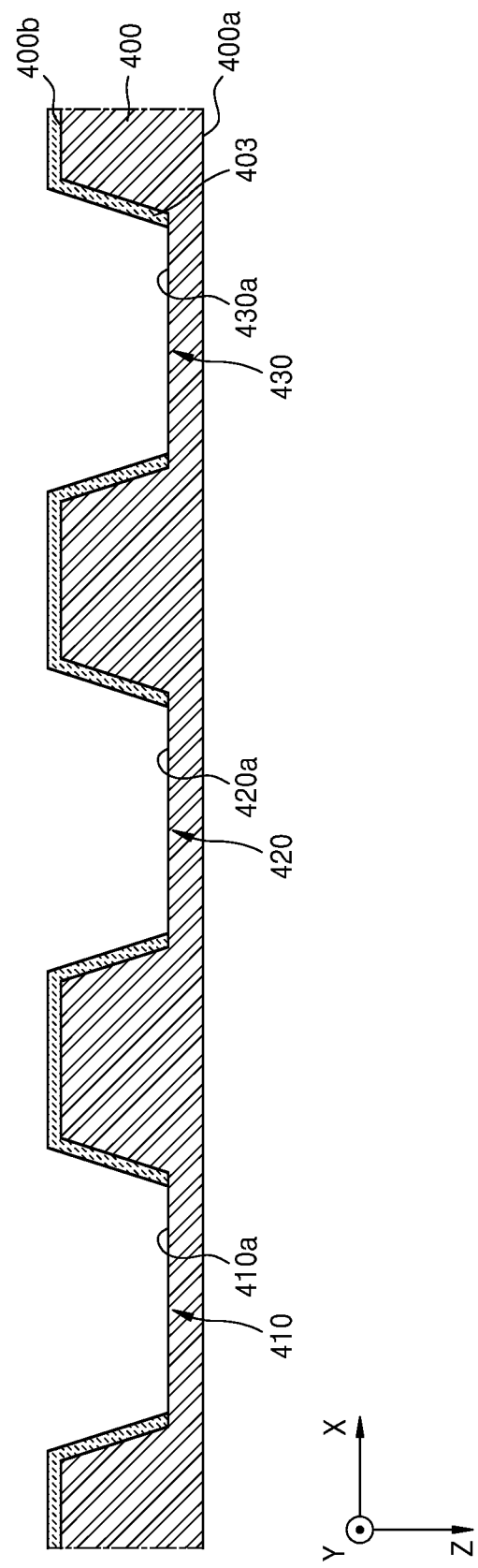

Subsequently, as shown in FIG. 4, the reflective layer 403 is formed on the inner surface of each of the first groove 410 to the third groove 430 of the top substrate 400. The reflective layer 403 shown in FIG. 4 may be formed by disposing a metal layer on an entire surface of the bottom surface 400b of the top substrate 400 using a sputtering method and removing portions of the metal layer on the first to third bottom surfaces 410a to 430a of the first groove 410 to the third groove 430. Dry etching that uses a photoresist may be used for removing the portions of the metal layer on the first to third bottom surfaces 410a to 430a of the first groove 410 to the third groove 430. That is, the photoresist is formed on the metal layer formed on the entire surface of the bottom surface 400b of the top substrate 400, and exposure and developing are performed such that the photoresist is removed from only the portions of the metal layer on the first to third bottom surfaces 410a to 430a of the first groove 410 to the third groove 430. Then, the portions of the metal layer on the first to third bottom surfaces 410a to 430a of the first groove 410 to the third groove 430 may be removed through dry etching. A process of removing the photoresist remaining on the reflective layer 403 is performed.

Because the inner surface of each of the first groove 410 to the third groove 430 is inclined with respect to the bottom surface 400b of the top substrate 400, the reflective layer 403 may be formed on the inner surface of each of the first groove 410 to the third groove 430 of the top substrate 400. When dry etching is used when forming the first groove 410 to the third groove 430, the inner surface of each of the first groove 410 to the third groove 430 is generally perpendicular to the bottom surface 400b of the top substrate 400, and accordingly, a defect may occur in which the metal layer is not formed on the inner surface of the first groove 410 to the third groove 430 when forming the metal layer on the entire surface of the bottom surface 400b of the top substrate 400.

Figure 5:
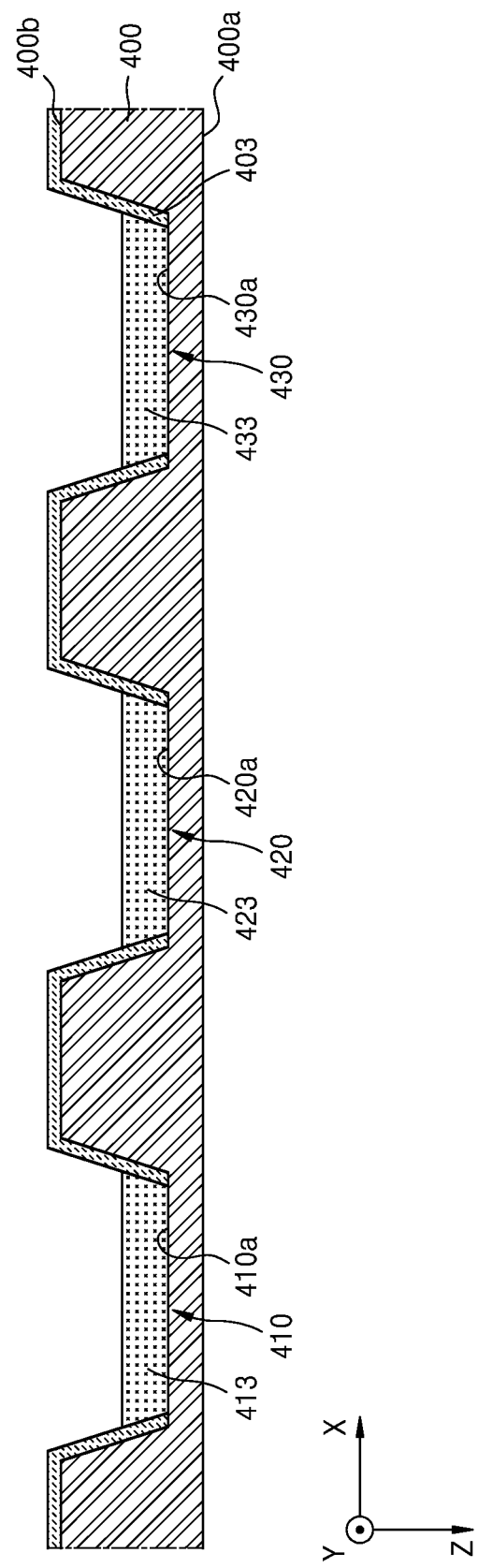

Then, as shown in FIG. 5, the first-color color filter layer 413 in the first groove 410, the second-color color filter layer 423 in the second groove 420, and the third-color color filter layer 433 in the third groove 430 are formed by using an inkjet printing method. Because the inkjet printing method is used, an amount of waste of the material for forming the color filter layer may be minimized. In addition, because the first-color color filter layer 413 to the third-color color filter layer 433 are arranged in the first groove 410 to the third groove 430, materials used in the process of forming the first-color color filter layer 413 to the third-color color filter layer 433 may be effectively prevented from being mixed with each other.

Figure 6:
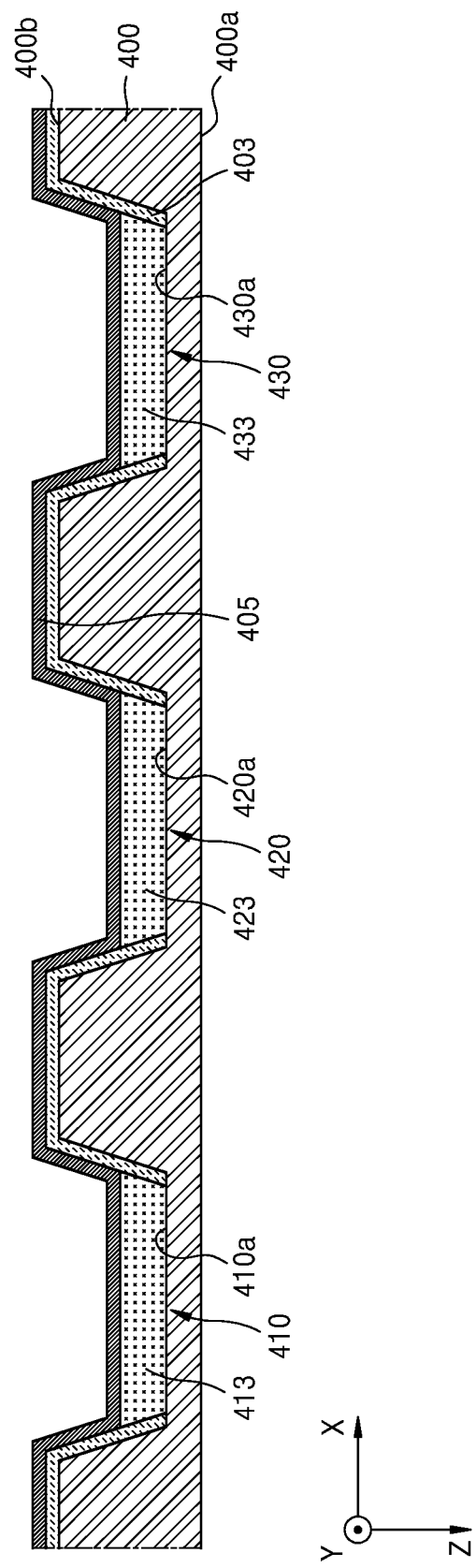
Figure 7:
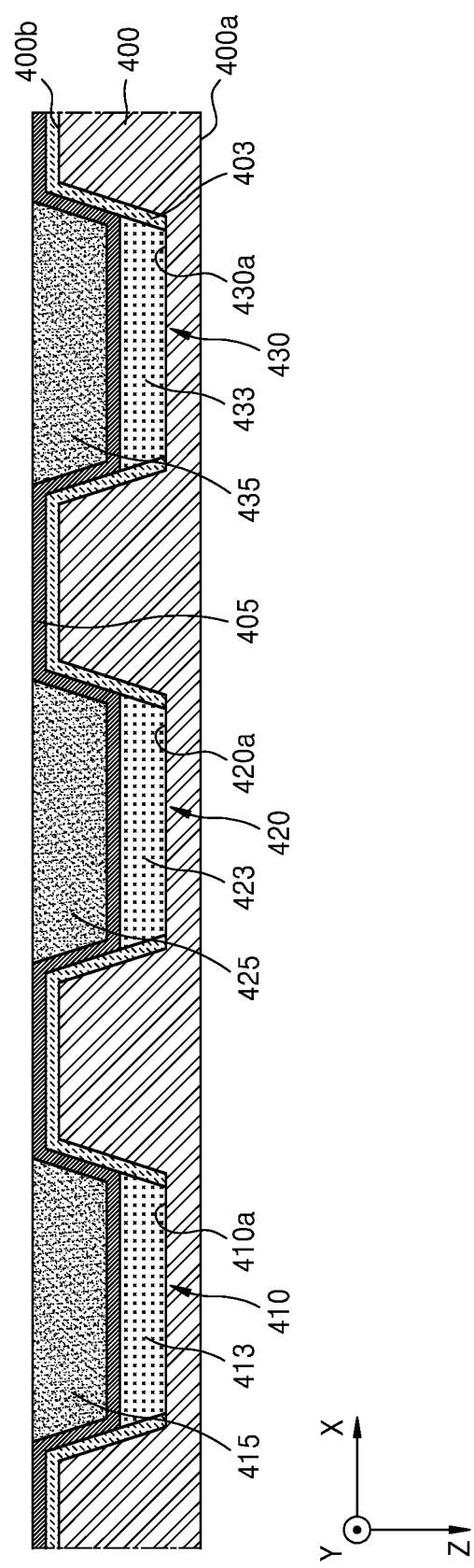

Subsequently, as shown in FIG. 6, the first protective layer 405 is formed by using a silicon oxide, a silicon nitride, or a silicon oxynitride to correspond to the entire surface of the bottom surface 400b of the top substrate 400. Therefore, the first protective layer 405 contacts not only the first-color color filter layer 413 to the third-color color filter layer 433 but also contacts the reflective layer 403 on the inner surface of the first groove 410 to the third groove 430. Because the reflective layer 403 is provided also on a portion of the bottom surface 400b of the top substrate 400 outside the first groove 410 to the third groove 430, the first protective layer 405 contacts the reflective layer 403 also in that portion. The first protective layer 405 may be formed by using a chemical vapor deposition (CVD). In this case, to prevent the first-color color filter layer 413 to the third-color color filter layer 433 formed in the above from being damaged, low-temperature CVD of 200° C. or below may be used.

After the first protective layer 405 is formed, the second-color quantum dot layer 425 in the second groove 420 and the third-color quantum dot layer 435 in the third groove 430 are formed. Because the inkjet printing method is used, an amount of waste of the material for forming the quantum dot layer may be minimized. In addition, because the second-color quantum dot layer 425 is arranged in the second groove 420 and the third-color quantum dot layer 435 is arranged in the third groove 430, materials used in the process of forming the second-color quantum dot layer 425 to the third-color quantum dot layer 435 may be effectively prevented from being mixed with each other. For reference, when needed, the transparent layer 415 may be formed on the first protective layer 405 in the first groove 410.

Figure 8:
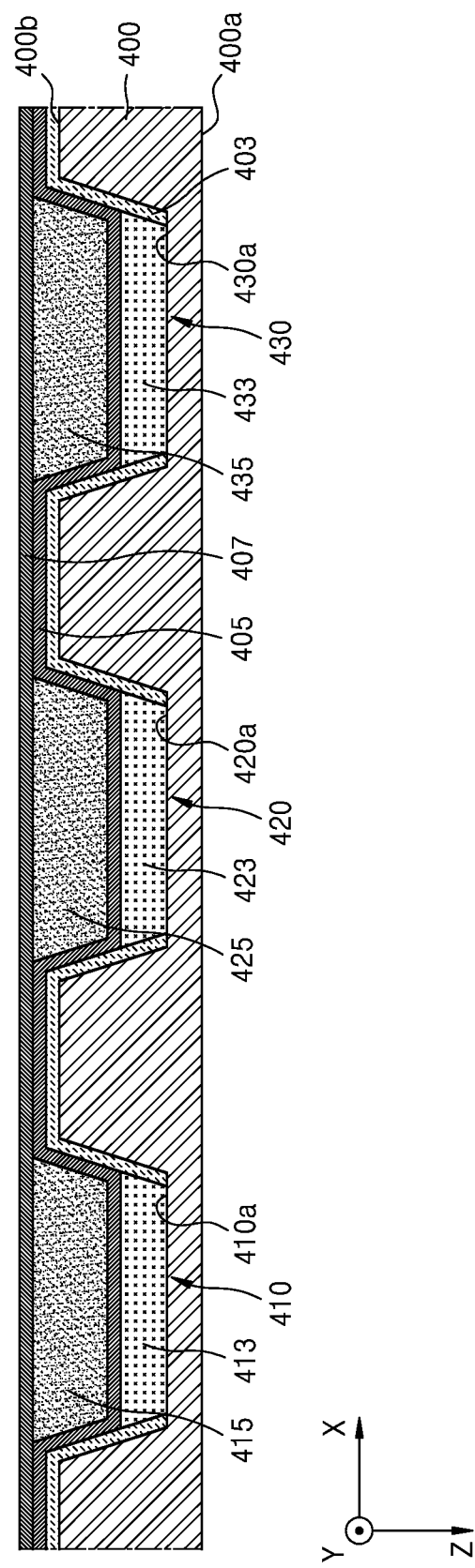

Subsequently, as shown in FIG. 8, the second protective layer 407 is formed by using a silicon oxide, a silicon nitride, or a silicon oxynitride to correspond to the entire surface of the bottom surface 400b of the top substrate 400. Therefore, the second protective layer 407 contacts not only the second-color quantum dot layer 425 and the third-color quantum dot layer 435 but also contacts the first protective layer 405 outside the first groove 410 to the third groove 430. The second protective layer 407 may be formed by using a chemical vapor deposition (CVD). In this case, to prevent the first-color color filter layer 413 to the third-color color filter layer 433 and/or the second-color quantum dot layer 425 and the third-color quantum dot layer 435 formed in the above from being damaged, low-temperature CVD of 200° C. or below may be used.

The display apparatus shown in FIG. 1 is manufactured by forming the top substrate 400, the first-color color filter layer 413 to the third-color color filter layer 433, the second-color quantum dot layer 425, the third-color quantum dot layer 435, the first protective layer 405, and the second protective layer 407, and then attaching the top substrate 400 to the bottom substrate 100. Prior to this, the first thin film transistor 210 to the third thin film transistor 230, the first pixel electrode 311 to the third pixel electrode 331, the intermediate layer 303, and the opposite electrode 305 are formed on the bottom substrate 100.

For reference, when the bottom substrate 100 is attached to the top substrate 400, it may mean that sealant is coated outside the display area and the bottom substrate 100 is bonded to the top substrate 400 by using the sealant. Alternatively, as shown in FIG. 1, it may mean that a filling material is arranged in a space between the bottom substrate 100 and the top substrate 400, and then the bottom substrate 100 is bonded to the top substrate 400 by the filling material. In this case, the filling material is a transparent filling material and may include a transparent polymer resin such as a polyimide or an epoxy.

As described above, the reflective layer 403 is provided on not only the inner surface of the first groove 410 to the third groove 430 of the top substrate 400 but also a portion of the bottom surface 400b of the top substrate 400 outside the first groove 410 to the third groove 430. However, the exemplary embodiments are not limited thereto.

Figure 9:
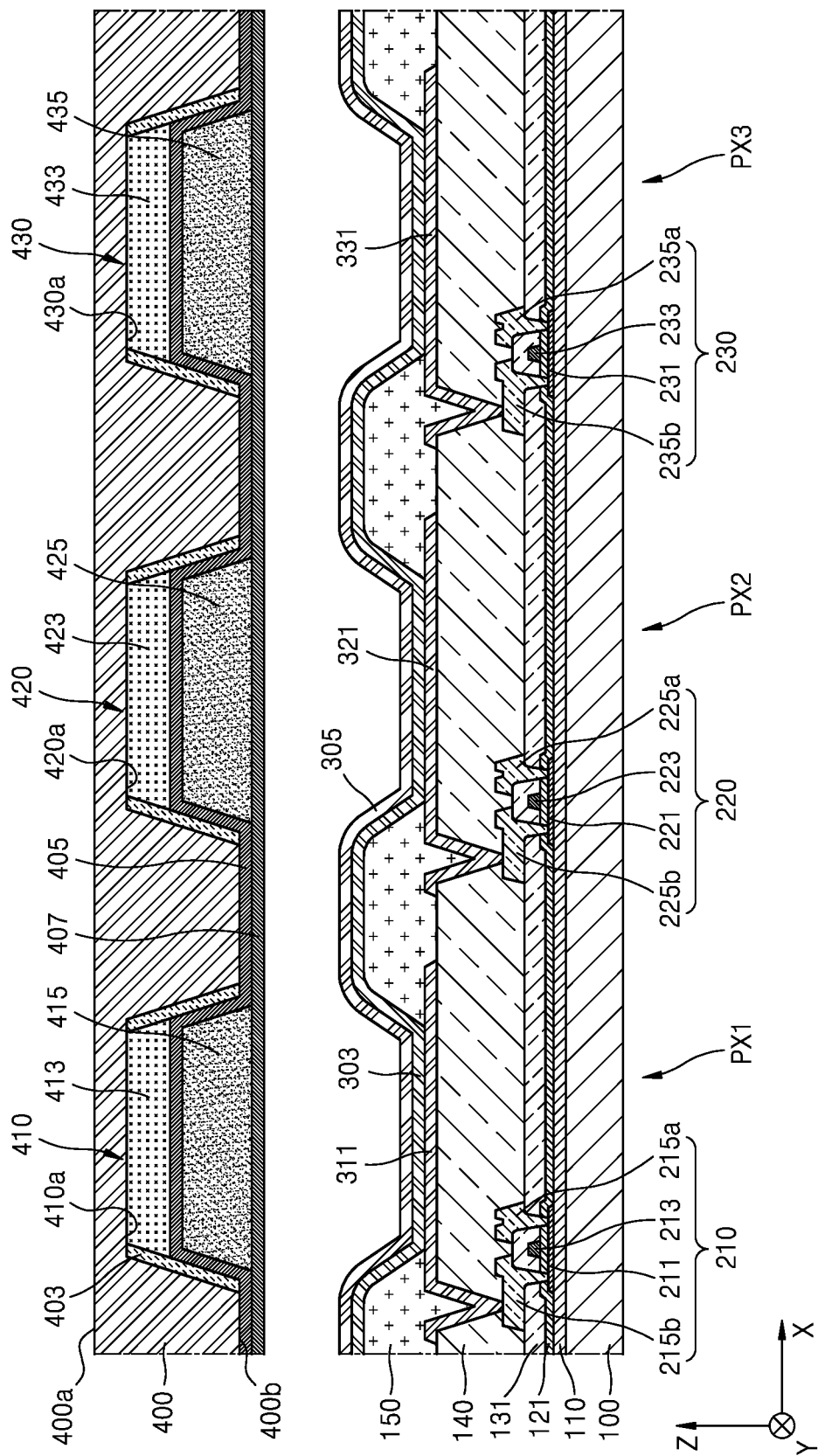
FIG. 9 is a cross-sectional view of another exemplary embodiment of a portion of a display apparatus constructed according to principles of the invention.

FIG. 9 is a cross-sectional view of another exemplary embodiment of a portion of a display apparatus constructed according to principles of the invention.

For example, as shown in FIG. 9, which is a cross-sectional view of a portion of the display apparatus according to another exemplary embodiment, the reflective layer 403 may be provided on only the inner surface of the first groove 410 to the third groove 430 of the top substrate 400 and may not be provided on a portion of the bottom surface 400b of the top substrate 400 outside the first groove 410 to the third groove 430. In this case, the first protective layer 405 contacts the bottom surface 400b of the top substrate 400 outside the first groove 410 to the third groove 430.

Figure 10:
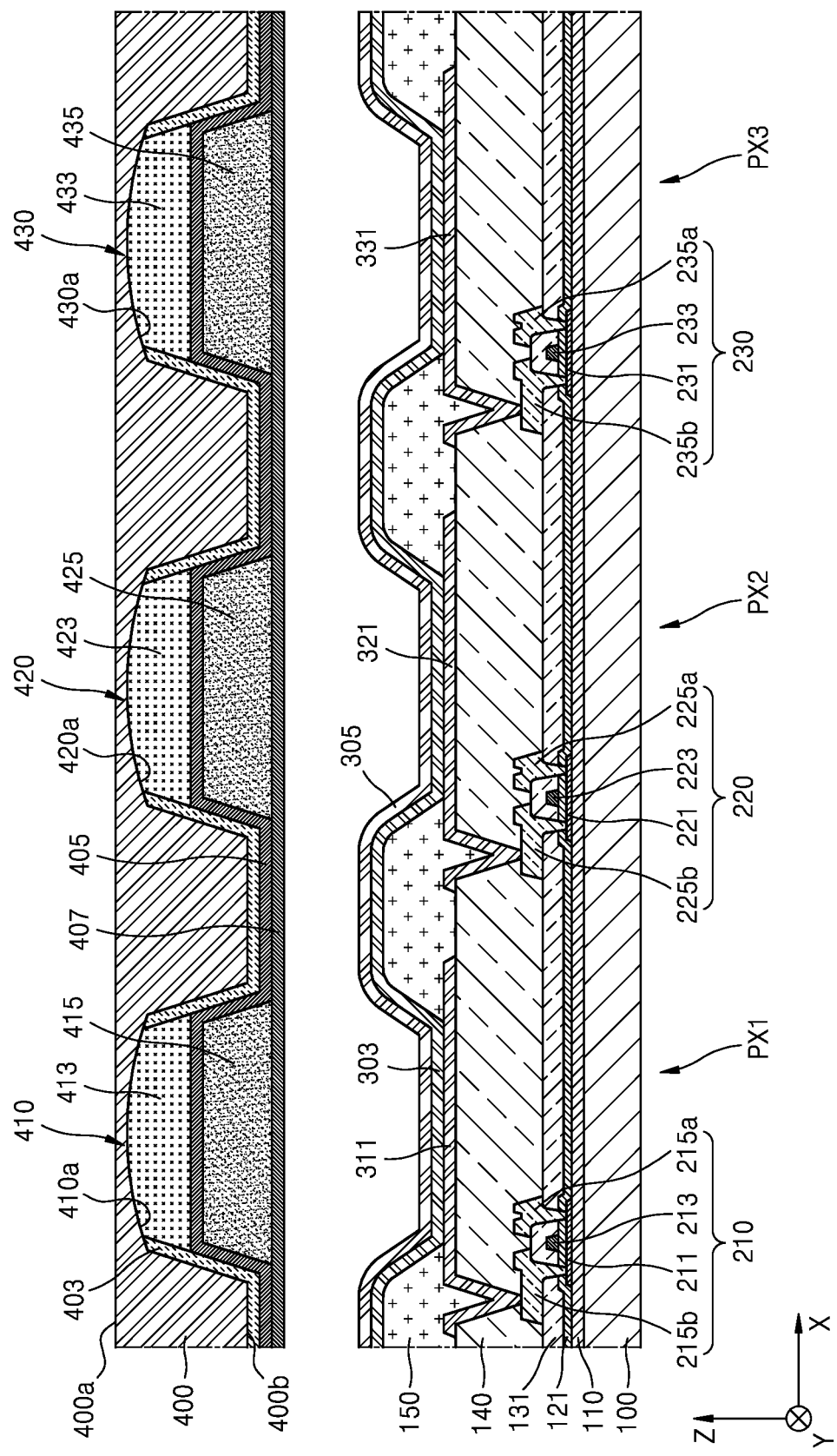
FIG. 10 is a cross-sectional view of still another exemplary embodiment of a portion of a display apparatus constructed according to principles of the invention.

FIG. 10 is a cross-sectional view of still another exemplary embodiment of a portion of a display apparatus constructed according to principles of the invention. The display apparatus according to some exemplary embodiments is different from the display apparatus described above with reference to FIG. 1 in the shape of the first to third bottom surfaces 410a, 420a, and 430a of the first groove 410 to the third groove 430. As shown in FIG. 10, in the display apparatus according to some exemplary embodiments, the first to third bottom surfaces 410a, 420a, and 430a of the first groove 410 to the third groove 430 are generally convex in a +z direction of the top surface 400a of the top substrate 400. Therefore, because light is emitted to the outside through the top substrate 400 with the structure of the generally convex lens shape, brightness of the top substrate 400 in the front direction (the +z direction) may be increased by a light-condensing effect with the structure of the generally convex lens shape.

As described above, in the display apparatus according to some exemplary embodiments, the first to third bottom surfaces 410a, 420a, and 430a of the first groove 410 to the third groove 430 are generally convex in the +z direction of the top surface 400a of the top substrate 400. A surface of the second-color color filter layer 423 in a direction to the second-color quantum dot layer 425 that contacts the second bottom surface 420a of the second groove 420, which is generally convex, and a surface of the third-color color filter layer 433 in a direction to the third-color quantum dot layer 435 that contacts the third bottom surface 430a of the third groove 430, which is generally convex, are substantially flat to be approximately substantially parallel to the top surface 400a of the top substrate 400. As described above, this is because, when forming the second-color color filter layer 423 and the third-color color filter layer 433, an inkjet printing method is used, and thus, materials for forming the second-color color filter layer 423 and the third-color color filter layer 433 are in a liquid state. During the manufacturing process, this liquid is hardened and/or fired and the second-color color filter layer 423 and the third-color color filter layer 433 change to a solid state. For the same reason, a surface of the first-color color filter layer 413 in a direction to the opposite electrode 305 may be generally parallel to the top surface 400a of the top substrate 400.

As described above, the display apparatus includes the organic light-emitting diodes as display elements, although the exemplary embodiments are not limited thereto. For example, in the structure shown in FIG. 1, the display elements connected to the thin film transistors, that is, the first to third thin film transistors 210, 220, and 230, may include other light-emitting elements, that are not the organic light-emitting diodes. That is, instead of the pixel electrodes, that is, the first pixel electrode 311, the second pixel electrode 321, and the third pixel electrode 331, a first light-emitting element may be connected to the first thin film transistor 210, a second light-emitting element may be connected to the second thin film transistor 220, and a third light-emitting element may be connected to the third thin film transistor 230. Each of the first to third light-emitting elements may include a first-color emission layer. The first-color emission layer may emit light in the first wavelength band and emit light of, for example, about 450 nm to about 495 nm. That is, in the display apparatus according to the exemplary embodiment, the first light-emitting element to the third light-emitting element of the display apparatus includes the first pixel electrode 311 to the third pixel electrode 331, and the opposite electrode 305 corresponding to the first pixel electrode 311 to the third pixel electrode 331, and the first-color emission layer of the first light-emitting element to the third light-emitting element is arranged on the first pixel electrode 311 to the third pixel electrode 331 such that the first-color emission layer is arranged between the opposite electrode 305 and the first pixel electrode 311 to the third pixel electrode 331. As another example of the first light-emitting element to the third light-emitting element, a nano light-emitting diode (LED) may be used. The nano LED is a kind of light-emitting diode and a size of the nano LED is about a size of a pixel of the display apparatus.

Some of the advantages that may be achieved by exemplary implementations of the invention and/or exemplary methods of the invention include the display apparatus having a low defect occurrence rate during a manufacturing process and a reduced amount of consumed material. However, the exemplary embodiments are not limited by this effect.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display apparatus comprising:
   a bottom substrate;
   a first light-emitable element, a second light-emitable element, and a third light-emitable element disposed over the bottom substrate, at least one of the first, second, and third light-emitable elements including a first-color emission layer;
   a top substrate including a first groove, a second groove, and a third groove defined in a bottom surface thereof facing the bottom substrate, the top substrate being over the bottom substrate with the first, second, and third light-emitable elements therebetween;
   a reflective layer on inner side surfaces of the first, second, and third grooves and on a portion of the bottom surface of the top substrate outside the first, second, and third grooves;
   a first-color color filter layer located at least partially in the first groove;
   each of a second-color color filter layer and a second-color quantum dot layer located at least partially in the second groove; and
   each of a third-color color filter layer and a third-color quantum dot layer located at least partially in the third groove.

2. The display apparatus of claim 1, wherein the first, second, and third light-emitable elements include:
   a first pixel electrode, a second pixel electrode, and a third pixel electrode; and
   an opposite electrode corresponding to the first, second, and third pixel electrodes,
   wherein the first-color emission layer is disposed over the first, second, and third pixel electrodes disposed between the first, second, and third pixel electrodes and the opposite electrode.

3. The display apparatus of claim 1, comprising the first-color emission layer to emit light in a first wavelength band, the second-color quantum dot layer to convert the light in the first wavelength band into light in a second wavelength band, and the third-color quantum dot layer to convert the light in the first wavelength band into light in a third wavelength band.

4. The display apparatus of claim 1, wherein the second-color quantum dot layer is disposed between the second-color color filter layer and the second light-emitable element, and the third-color quantum dot layer is disposed between the third-color color filter layer and the third light-emitable element.

5. The display apparatus of claim 4, comprising the first-color color filter layer contacting a bottom surface of the first groove, the second-color color filter layer contacting a bottom surface of the second groove, and the third-color color filter layer contacting a bottom surface of the third groove.

6. The display apparatus of claim 4, further comprising a first protective layer disposed between the second-color color filter layer and the second-color quantum dot layer and between the third-color color filter layer and the third-color quantum dot layer.

7. The display apparatus of claim 6, wherein the first protective layer is disposed as a single body over an entire surface of the top substrate.

8. The display apparatus of claim 6, further comprising a transparent layer located at least partially in the first groove disposed between the first-color color filter layer and the first light-emitable element.

9. The display apparatus of claim 8, wherein the first protective layer is disposed between the first-color color filter layer and the transparent layer.

10. The display apparatus of claim 6, further comprising a second protective layer disposed between the second-color quantum dot layer and the second light-emitable element and between the third-color quantum dot layer and the third light-emitable element.

11. The display apparatus of claim 10, wherein the second protective layer is disposed as a single body over an entire surface of the top substrate.

12. The display apparatus of claim 10, wherein the second protective layer contacting the first protective layer over a portion of the bottom surface of the top substrate outside the first, second, and third grooves.

13. The display apparatus of claim 1, wherein an inner surface of at least one of the first, second, and third grooves is inclined with respect to the bottom surface of the top substrate.

14. The display apparatus of claim 1, wherein a first cross-sectional area of at least one of the first, second, and third grooves along a first virtual plane substantially parallel to the bottom surface of the top substrate is smaller than a second cross-sectional area of at least one of the first, second, and third grooves along a second virtual plane substantially parallel to the bottom surface of the top substrate, the second virtual plane being closer to the bottom surface of the top substrate than the first virtual plane.

15. The display apparatus of claim 1, wherein the first, second, and third grooves overlap the first, second, and third light-emitable elements when viewed in a direction substantially perpendicular to the top substrate.

16. The display apparatus of claim 1, wherein the first-color color filter layer is located in the first groove; the second-color color filter layer and the second-color quantum dot layer are each located in the second groove; and the third-color color filter layer and the third-color quantum dot layer are each located in the third groove.

17. The display apparatus of claim 1, wherein each of the first, second, and third light-emitable elements include the first-color emission layer.

18. The display apparatus of claim 1, wherein a bottom surface of at least one of the first, second, and third grooves is generally convex in a direction to a top surface of the top substrate.

19. The display apparatus of claim 18, wherein:
the second-color quantum dot layer is disposed between the second-color color filter layer and the second light-emitable element, and the third-color quantum dot layer is disposed between the third-color color filter layer and the third light-emitable element; and
a surface of the second-color color filter layer in a direction to the second-color quantum dot layer is substantially flat, and a surface of the third-color color filter layer in a direction to the third-color quantum dot layer is substantially flat.

* * * * *